(12) United States Patent
Asmanis et al.

(10) Patent No.: US 9,780,737 B1
(45) Date of Patent: Oct. 3, 2017

(54) DIGITALLY-CONTROLLED TRANSIMPEDANCE AMPLIFIER (TIA) CIRCUIT AND METHODS

(71) Applicant: Avago Technologies General IP (Singapore) Pte. Ltd., Singapore (SG)

(72) Inventors: Georgios Asmanis, Lake Forrest, CA (US); Faouzi Chaahoub, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/087,711

(22) Filed: Mar. 31, 2016

(51) Int. Cl.
| | |
|---|---|
| H03F 3/08 | (2006.01) |
| H03F 1/08 | (2006.01) |
| H03F 1/34 | (2006.01) |
| H03G 3/00 | (2006.01) |
| H04B 10/079 | (2013.01) |

(52) U.S. Cl.
CPC ............... *H03F 3/08* (2013.01); *H03F 1/34* (2013.01); *H03G 3/001* (2013.01); *H03F 2200/375* (2013.01); *H04B 10/07955* (2013.01)

(58) Field of Classification Search
CPC .................................. H03F 3/08; H03F 3/082
USPC .................. 330/293, 254, 308, 129
See application file for complete search history.

(56) References Cited

U.S. PATENT DOCUMENTS

| | | |
|---|---|---|
| 7,239,199 B1 | 7/2007 | Chien et al. |
| 8,126,094 B2 | 2/2012 | Komaili et al. |
| 8,665,920 B2 | 3/2014 | Huang et al. |
| 2015/0086221 A1 | 3/2015 | Shringarpure et al. |

OTHER PUBLICATIONS

"ONET2591TA—2.5 Gbps Trans-impedance Amplifier with AGC and RSSI", Texas Instruments, 2005.

*Primary Examiner* — Khanh V Nguyen
*Assistant Examiner* — Khiem Nguyen (57) ABSTRACT

A digitally-controlled transimpedance amplifier (TIA) circuit is provided in which a plurality of feedback loops are digitally controlled, including, but not limited to, the DC offset cancellation loop, the variable gain control loop, and the TIA feedback impedance adjustment loop. The digitally-controlled TIA circuit includes digital loop-control circuitry that consumes less area on the TIA IC chip than the analog circuitry traditionally used to perform the feedback loop control in the analog domain. In addition, because digital logic continues to shrink as IC processes continue to evolve, the size of the IC chip packages will further decrease over time, leading to a smaller footprint in systems in which they are employed. The digital loop control circuitry is also capable of independently varying the gains of multiple gain stages of the variable gain control circuit to provide better control over the gain stages and better overall performance of the TIA circuit.

20 Claims, 5 Drawing Sheets

DIGITALLY-CONTROLLED TRANSIMPEDANCE AMPLIFIER (TIA) CIRCUIT AND METHODS

TECHNICAL FIELD OF THE INVENTION

The invention relates to transimpedance amplifier (TIA) circuits. More particularly, the invention relates to a digitally-controlled TIA circuit.

BACKGROUND OF THE INVENTION

A typical optical receiver (Rx) includes at least one photodiode that detects an optical signal and converts it into an electrical current signal and at least one transimpedance amplifier (TIA) that converts the electrical current signal into an electrical voltage signal. The photodetector, which is typically a P-intrinsic-N (PIN) photodiode, produces an electrical current signal in response to light detected by the photodetector. The TIA converts this electrical current signal into an output voltage signal having some gain, commonly referred to as transimpedance gain. This output voltage signal is further processed by other circuitry of the optical Rx (e.g., a limiting amplifier (LA), clock and data recovery (CDR) circuitry, etc.).

The TIA circuit typically includes several control loops for improving performance, such as a direct current (DC) offset cancellation loop, an automatic variable gain amplifier (VGA) stage loop, and a TIA feedback impedance adjustment loop. Each of these loops utilizes analog components such as operational amplifiers (Op Amps), capacitors and resistors to implement the analog functionality needed. Such components are complex and require a large area on an integrated circuit (IC) chip in order to implement them with accuracy. In high-speed TIA circuits, such analog control circuitry can occupy the majority of the IC chip area, which increases the cost of the IC chip solution and leads to parasitic capacitances that degrade RF performance and/or increase power consumption. In addition, using analog methods to tune the feedback resistance of the TIA feedback impedance adjustment loop is not precise and suffers from limitations due to the precision and order of the adjustment function, the number of elements that can be controlled, etc.

A need exists for a TIA circuit having control loops that have greater precision and improved performance, that can be implemented in a smaller area on the IC chip, and that can be manufactured with improved IC chip yield and at reduced IC chip costs.

DETAILED DESCRIPTION

In accordance with illustrative embodiments, a digitally-controlled TIA circuit is provided in which a plurality of feedback loops are digitally controlled, including, but not limited to, the DC offset cancellation loop, the VGA loop, and the TIA feedback impedance adjustment loop.

A few illustrative embodiments of the digitally-controlled TIA circuit and method will now be described with reference to the FIGS. 1-5, in which like reference numerals represent like elements, features or components.

As used in the specification and appended claims, the terms "a," "an," and "the" include both singular and plural referents, unless the context clearly dictates otherwise. Thus, for example, "a device" includes one device and plural devices.

It should be noted that when an element is referred to herein as being "connected to" or "coupled to" or "electrically coupled to" another element, it can be directly connected or coupled, or intervening elements may be present.

Figure 1:
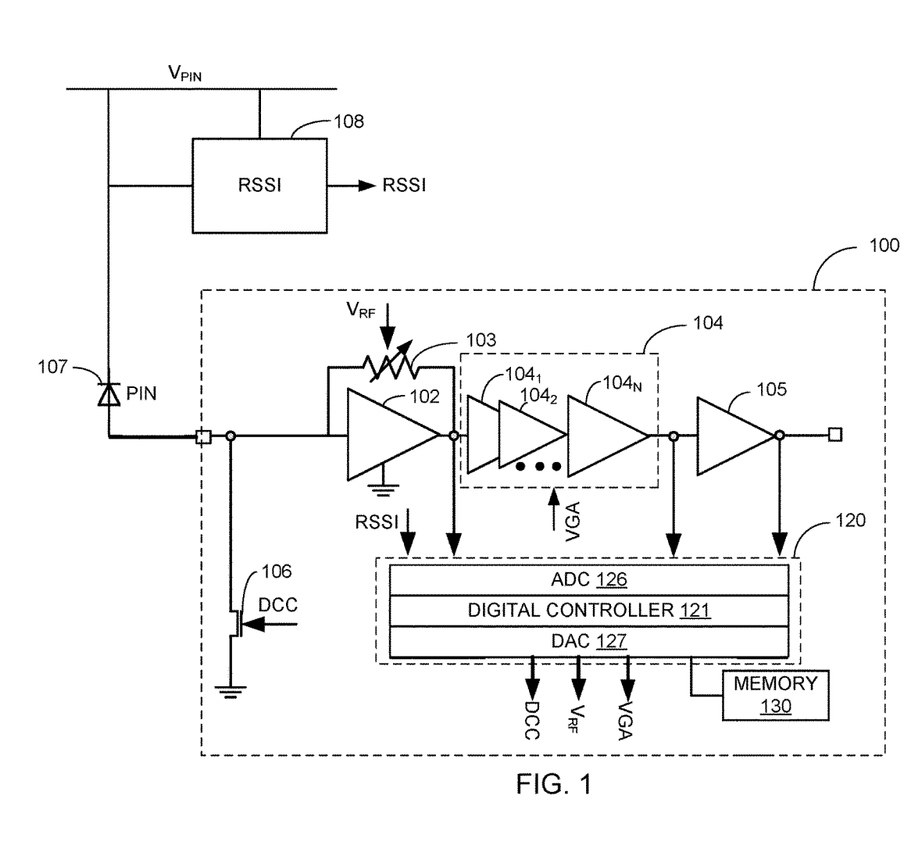
FIG. 1 illustrates a block diagram of a TIA circuit in accordance with an illustrative embodiment.

FIG. 1 illustrates a block diagram of a digitally-controlled TIA circuit 100 in accordance with an illustrative embodiment. The TIA circuit 100 includes a TIA 102, a variable feedback impedance 103 connected between an output terminal of the TIA 102 and the inverting input terminal of the TIA 102, a VGA circuit 104 having an input terminal that is connected to the output terminal of the TIA 102, an output driver 105 having an input terminal that is connected to an output terminal of the VGA circuit 104, DC offset cancellation circuitry 106 connected to the inverting input terminal of the TIA 102, and digital loop-control circuitry 120.

A PIN diode 107, which is external to the TIA circuit 100, has an anode that is connected to the inverting terminal of the TIA 102 and a cathode that is connected to a Received Signal Strength Indicator (RSSI) circuit 108 and to a PIN supply voltage, $V_{PIN}$. The RSSI circuit 108 is external to the TIA circuit 100. The RSSI circuit 108 outputs an indicator signal, RSSI, which is indicative of the optical power level of the incident light striking the PIN diode 107. The RSSI signal is used to produce a voltage signal, $V_{RF}$, which, in turn, is used to vary a variable impedance of the TIA 102, which is typically an operational amplifier (Op Amp). For ease of illustration, the variable impedance 103 of the TIA 102 is represented by the feedback resistor, but typically includes one or more variable resistors in parallel with one or more variable capacitors (not shown). The circuitry that is used to convert the RSSI signal into the voltage signal $V_{RF}$ is not shown because such circuitry is well known and is outside the scope of the invention.

The invention is not limited with respect to the configuration of the RSSI circuit 108. Known RSSI circuits exist for determining the optical power level of the incident light based on a measurement of the electrical current produced by a PIN diode. A typical RSSI circuit includes an Op Amp and a filter circuit. The filter circuit is typically a first-order filter circuit comprising a resistor and a capacitor connected in series. The filter circuit acts as a low-pass filter that removes high frequency noise from the supply voltage, $V_{PIN}$. By sensing the voltage across the resistor, the input current signal output by the PIN diode 107 to the RSSI circuit 108 is sensed. The input current signal is proportional to the optical power level of the light striking the PIN diode 107. Hence, the RSSI circuit 108 detects the input optical power and outputs the RSSI signal. The variable impedance 103 of the TIA 102 is then adjusted based on the RSSI signal to increase the gain of the TIA 102 when the input optical power level is lower and to decrease the gain of the TIA 102 when the input optical power level is higher.

The anode of the PIN diode 107 is also connected to the DC offset cancellation circuitry 106, which is represented by a single n-type Metal Oxide Semiconductor Field Effect Transistor (NMOS). Although a single NMOS is shown to represent the DC offset cancellation circuitry 106, the DC offset cancellation circuitry may include additional or other circuitry not shown in FIG. 1. DC offset cancellation circuits used in TIA circuits to cancel out the DC component of the signal output from the PIN diode are well known. The invention is not limited with respect to the circuit configuration of the DC offset cancellation circuitry. As will be understood by persons of skill in the art, in view of the description provided herein, a variety of circuit configurations may be used to perform DC offset cancellation.

In accordance with this illustrative embodiment, an analog-to-digital converter (ADC) 126 of the digital loop-control circuitry 120 samples the outputs of the RSSI circuit 108, the TIA 102, the VGA circuit 104, and the output driver circuit 105 and converts the analog signals into respective digital values. The digital controller 121 then performs a loop-control algorithm that processes these digital values to produce respective digital loop-control values. The respective digital loop-control values are then converted by the digital-to-analog converter (DAC) 127 of the digital loop-control circuitry 120 into respective analog loop-control values, DCC, $V_{RF}$ and VGA. The analog loop-control values, DCC, $V_{RF}$ and VGA, are output as feedback signals to the DC offset cancellation circuitry 106, to the TIA 102, and to the VGA circuit 104, respectively, to cause those circuits to be adjusted accordingly. Specifically, the analog loop-control value, DCC, drives the gate of the NMOS 106 to cancel the DC offset at the inverting terminal of the TIA 102, the analog loop-control value, $V_{RF}$, varies the variable impedance 103 of the TIA 102 to vary the gain of the TIA 102 and the analog loop-control signal, VGA, varies the gain of the VGA circuit 104 to perform offset cancellation.

The digital controller 121 may be any type of digital computational device such as, for example, a microprocessor, a microcontroller, a digital signal processor, an application specific integrated circuit (ASIC), a field programmable gate array (FPGA). In such devices, the loop-control algorithm is typically implemented in software or in a combination of software and firmware. The software or firmware is stored in a non-transitory computer-readable memory device (not shown) that is internal to or external to the digital controller 121.

An alternative to the digital controller 121 performing a loop-control algorithm that processes the digital values output from the ADC 126 to produce respective digital loop-control values, the loop-control algorithm performed by the digital controller 121 may use one or more lookup tables (LUTs) that store the digital loop-control values that are retrieved from the LUTs by the digital controller 121 and output to the DAC 127. An illustrative example of such an algorithm will now be described with reference to FIG. 2.

Figure 2:
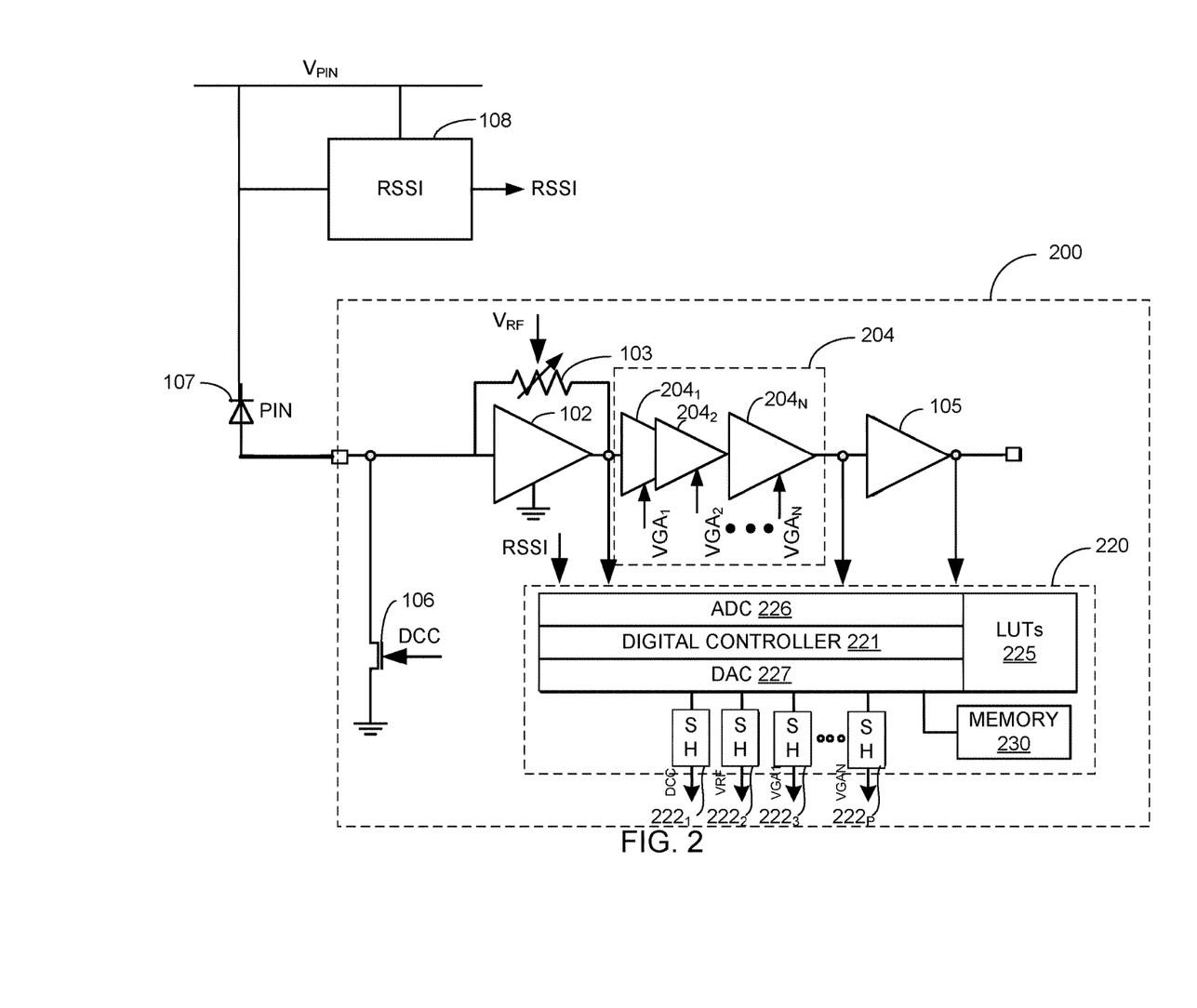
FIG. 2 illustrates a block diagram of a digitally-controlled TIA circuit in accordance with another illustrative embodiment.

FIG. 2 illustrates a block diagram of a digitally-controlled TIA circuit 200 in accordance with another illustrative embodiment. The TIA circuit 200 includes the TIA 102, the variable impedance 103, a VGA circuit 204 having an input terminal that is connected to the output terminal of the TIA 102, an output driver 105 having an input terminal that is connected to an output terminal of the VGA circuit 204, the DC offset cancellation circuitry 106 connected to the inverting input terminal of the TIA 102, and digital loop-control circuitry 220.

In accordance with this embodiment, the digital loop-control circuitry 220 uses one or more lookup tables (LUTs) 225 to store values used by the digital controller 221 to produce the loop-control values that are fed back to the VGA circuit loop, the DC offset cancellation loop, and the feedback impedance adjustment loop. The ADC 226 converts the analog values output from the RSSI circuit 108, the TIA 102, the VGA circuit 204, and the output driver circuit 105 into respective digital values. The digital controller 221 uses the digital values to retrieve respective digital loop-control values from the LUTs 225. The digital loop-control circuitry 220 includes P sample-and-hold (S/H) circuits $222_1$-$222_P$ that hold the respective loop-control values output from the digital controller 221 for respective periods of time, where P is a positive integer that is equal to the number of loops that are being controlled by the digital controller 221. In accordance with this illustrative embodiment, P=N+2 loops are being controlled, where N is equal to the number of variable gain stages that are in the VGA circuit 204. The S/H circuits $222_1$-$222_P$ are periodically refreshed so that errors are not introduced due to current leakage.

One of the benefits of this illustrative embodiment is that each gain stage $204_1$-$204_N$ of the VGA circuit 204 is a variable gain stage that is individually adjusted based on a respective loop-control value, $VGA_1$-$VGA_N$, output from the S/H circuits $222_3$-$222_P$, respectively. Having this level of granularity in adjusting the VGA circuit 204 provides more precise control over the linearity and overload performance of the TIA circuit 200. In contrast, with typical VGA circuits, a single value is fed back to the VGA circuit and used to equally adjust the gain of all of the gain stages of the VGA circuit.

In accordance with this illustrative embodiment, the digital controller 221 is implemented as a state machine. Implementing the digital controller 221 as a state machine enables it to be implemented with a relatively small amount of digital logic in a relatively small area compared to, for example, a microprocessor or microcontroller. Consequently, the TIA circuit 200 consumes a very small area on the TIA IC chip (not shown) on which the TIA circuit 200 is integrated. An illustrative embodiment of the state machine is described below with reference to FIG. 5.

The state machine of the digital controller 221 uses values stored in the LUTs 225 as loop-control values, which are then converted into analog loop-control values by the DAC 227 and output to the S/H circuits $222_1$-$222_P$. The LUTs 225 preferably store multi-dimensional values so that a loop-control function of virtually any order can be implemented by the digital loop-control circuitry 220. This allows greater precision to be achieved in controlling the respective feedback loops of the TIA 102, the VGA circuit 204 and the DC offset cancellation circuit 106.

In accordance with this illustrative embodiment, the ADC 226 of the digital loop-control circuitry 220 samples the outputs of the RSSI circuit 108, the TIA 102, the VGA circuit 204 and the output driver circuit 105 and converts these analog signals into respective digital values. The state machine of the digital controller 221 then uses these digital values to lookup respective digital loop-control values in the LUTs 225. The respective digital loop-control values retrieved from the LUTs 225 are then converted by the DAC 227 into respective analog loop-control values, which are then output to the respective S/H circuits $222_1$-$222_P$. The analog loop-control values held in the S/H circuits $222_1$-$222_P$ are provided as feedback signals to the DC offset cancellation circuitry 106, to the variable impedance 103, and to the variable gain stages $204_A$-$204_N$, respectively, causing those circuits to be adjusted accordingly.

There are several benefits to the digital loop-control circuitry 220 shown in FIG. 2. One benefit is that it consumes less area on the TIA IC chip compared to TIA IC chips that perform the feedback loop control in the analog domain. In addition, because digital logic continues to shrink as IC processes continue to evolve, the size of the IC chip packages will further decrease over time, leading to a smaller footprint in the systems in which they are employed. Another benefit is realized through use of the LUTs 225. The LUTs 225 can be implemented in, for example, one-time programmable (OTP) register files on each TIA IC chip. Such register files can be formed in IC chips with very high yield, leading to a higher overall chip yield, which reduces costs. Another advantage of the LUTs 225 is that, as stated above, the values stored in them can be multi-dimensional. The use of these multi-dimensional values improves algorithmic efficiency and overall performance.

Figure 3:
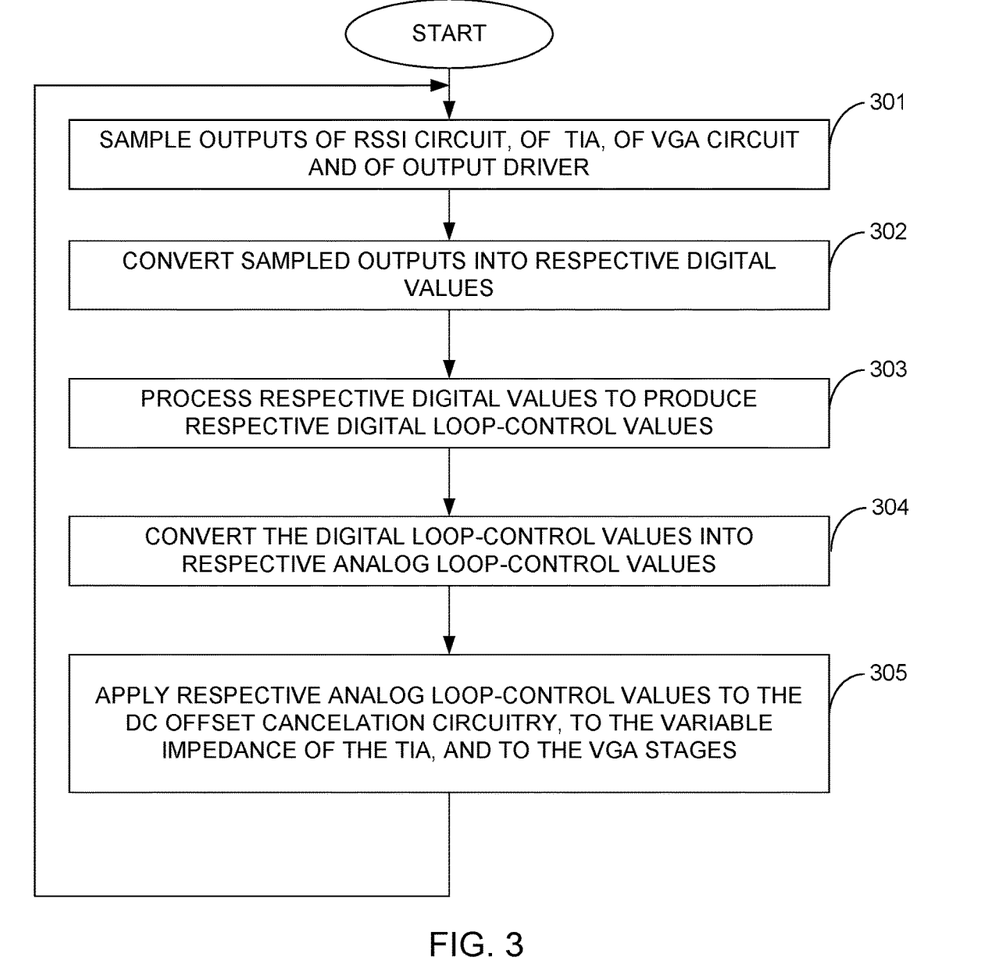
FIG. 3 illustrates a flow diagram of the method performed by the TIA circuit in accordance with an illustrative embodiment.

FIG. 3 illustrates a flow diagram of the method performed by the TIA circuit in accordance with an illustrative embodiment. In accordance with this illustrative embodiment, an ADC samples the outputs of an RSSI circuit, a TIA, a VGA circuit, and an output driver circuit, as indicated by block 301. The ADC converts the analog signals into respective digital values, as indicated by block 302. The digital controller of the digital loop control circuitry then performs a loop-control algorithm that processes the digital values to produce respective digital loop-control values, as indicated by block 303. The respective digital loop-control values are then converted by a DAC into respective analog loop-control values, as indicated by block 304. The analog loop-control values are then applied as feedback signals to DC offset cancellation circuitry, to the TIA, and to the VGA stages, respectively, to cause those circuits to be adjusted accordingly, as indicated by block 305.

Figure 4:
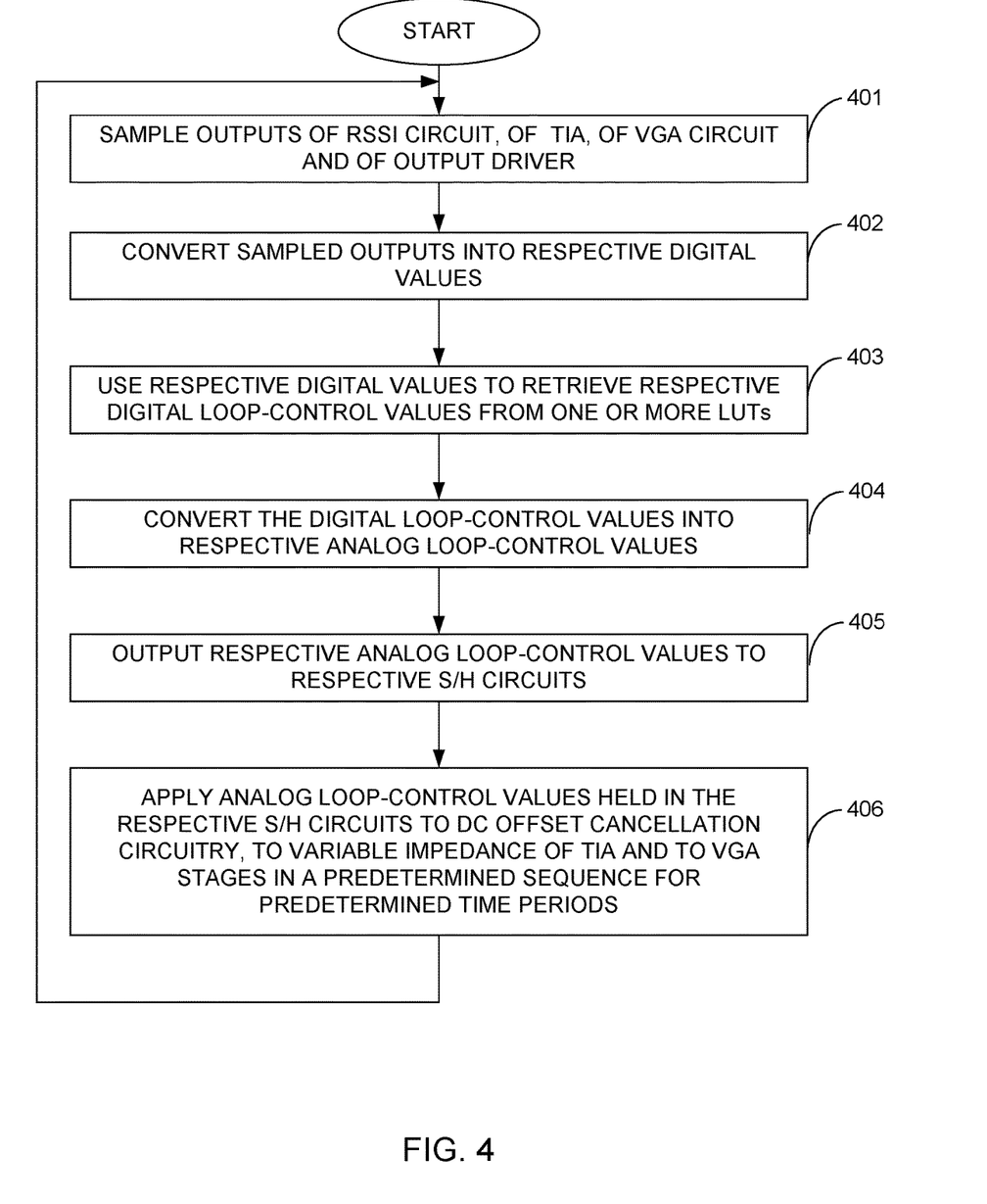
FIG. 4 illustrates a flow diagram of the method performed by the TIA circuit in accordance with another illustrative embodiment.

FIG. 4 illustrates a flow diagram of the method performed by the TIA circuit in accordance with another illustrative embodiment. In accordance with this illustrative embodiment, an ADC samples the outputs of an RSSI circuit, a TIA, a VGA circuit, and an output driver circuit, as indicated by block 401. The ADC converts the analog signals into respective digital values, as indicated by block 402. The digital controller of the digital loop control circuitry then performs a loop-control algorithm that uses the digital values to retrieve respective digital loop-control values from one or more LUTs, as indicated by block 403. The respective digital loop-control values are then converted by a DAC into respective analog loop-control values, as indicated by block 404, and output to respective S/H circuits, as indicated by block 405. The analog loop-control values held in the respective S/H circuits are then applied as feedback signals to DC offset cancellation circuitry, to the TIA, and to the VGA stages, respectively, to cause those circuits to be adjusted accordingly, as indicated by block 406.

The portions of the methods represented by blocks 304 and 404 are implemented in a combination of hardware (e.g., a microprocessor, microcontroller, ASIC, DSP, FPGA, combinational logic, a state machine, etc.) and software and/or firmware. The software and/or firmware is stored on a non-transitory computer-readable medium that is either internal to or external to the digital controllers 121, 221. In FIGS. 1 and 2, memory elements 130 and 230, respectively, represent computer-readable mediums that are external to the digital controllers 121 and 221, respectively, and that may be used to store computer instructions comprising the software/firmware.

Figure 5:
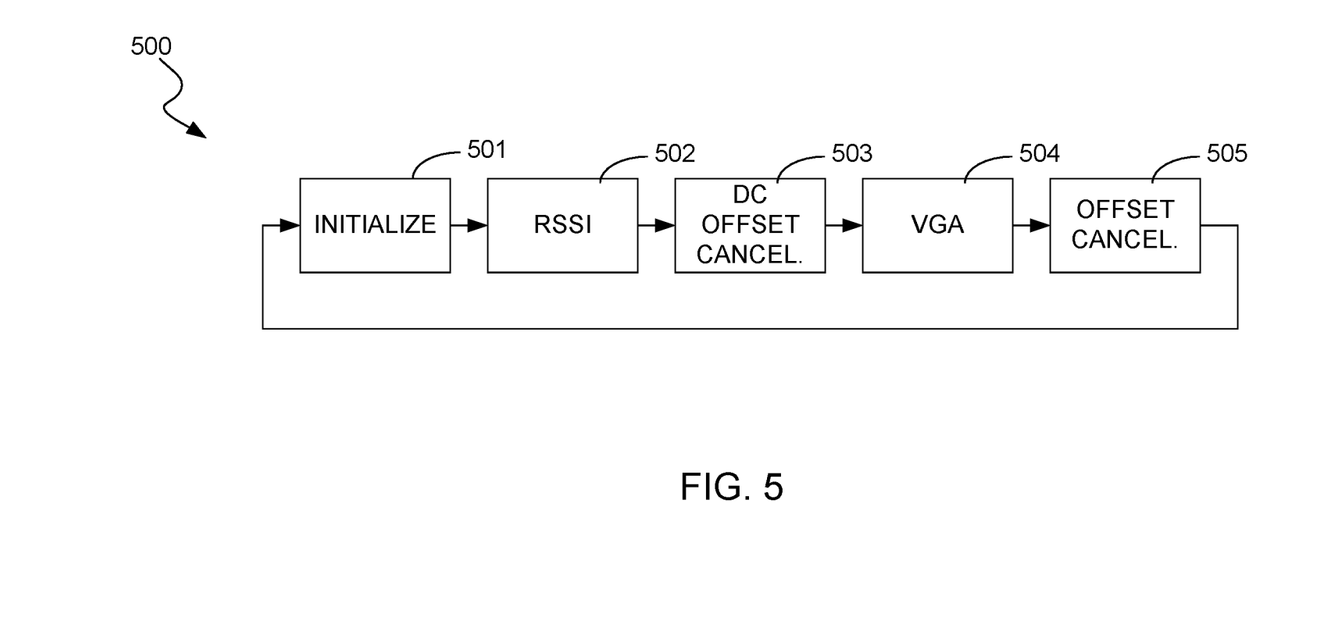
FIG. 5 illustrates a block diagram of the digital controller shown in FIG. 2 implemented as a state machine.

FIG. 5 illustrates a block diagram of the digital controller 221 shown in FIG. 2 implemented as a state machine 500. In accordance with this illustrative embodiment, the state machine 500 comprises five sub-state machines, namely, an initialization sub-state machine 501, an RSSI sub-state machine 502, a DC offset cancelation sub-state machine 503, a VGA sub-state machine 504, and an offset cancelation sub-state machine 505. In accordance with this illustrative embodiment, the sub-state machines 501-505 perform their corresponding functions in a round-robin sequence. The initialization sub-state machine 501 is first in the round-robin sequence. During an initialization period, the samples acquired by the ADC 226 are converted into digital values, which are then forwarded by the sub-state machine 501 to the respective sub-state machines 502-505. The initialization sub-state machine 501 then hands off control to the RSSI sub-state machine 502.

The RSSI sub-state machine 502 uses the digital loop-control value forwarded to it by the initialization sub-state machine 501 to retrieve a respective digital loop-control value from the LUTs 225. The retrieved digital loop-control value is then forwarded to the DAC 227, which converts the digital loop-control value into an analog loop-control value, $V_{RF}$, and outputs it to the respective S/H circuit $222_2$. The S/H circuit $222_2$ maintains the analog loop-control value at that value for a predetermined time period so that variable impedance 103 is held at a predetermined impedance value for the predetermined time period. Once the predetermined time period has ended, the RSSI sub-state machine 502 hands off control to the DC offset cancelation sub-state machine 503.

The DC offset cancellation sub-state machine 503 uses the digital loop-control value forwarded to it by the initialization sub-state machine 501 during the initialization period to retrieve a respective digital loop-control value from the LUTs 225. The retrieved digital loop-control value is then forwarded to the DAC 227, which converts the digital loop-control value into an analog loop-control value, DCC, and outputs it to the respective S/H circuit $222_1$. The S/H circuit $222_1$ maintains the analog loop-control value at that value for a predetermined time period so that DC offset cancelation circuitry 106 provides a DC offset cancelation value to the inverting terminal of the TIA 102 for the predetermined time period to remove the DC component from the signal provided by the PIN diode 107 to the TIA 102. Once the predetermined time period has ended, the DC offset cancelation sub-state machine 503 hands off control to the VGA sub-state machine 504.

The VGA sub-state machine 504 uses the digital loop-control value forwarded to it by the initialization sub-state machine 501 to retrieve N digital loop-control values from the LUTs 225. The retrieved digital loop-control value are then forwarded to the DAC 227, which converts the digital loop-control values into N analog loop-control values, $VGA_1$-$VGA_N$, respectively, and outputs them to the respective S/H circuits $222_3$-$222_P$. The S/H circuits $222_3$-$222_P$ maintain the analog loop-control values for a predetermined time period so that the gains of the respective gain stages $204_1$-$204_N$ are held constant for the predetermined time period. Once the predetermined time period has ended, the VGA sub-state machine 504 hands off control to the offset cancelation sub-state machine 505.

In contrast to the DC offset cancelation sub-state machine 503, the purpose of the offset cancelation sub-state machine 505 is to remove an offset at the input of the TIA 102 that can cause the output of the output driver circuit 105 to become saturated. This is prevented by adjusting the gain of one or more of the VGA gain stages $204_1$-$204_N$ based on the signal output from the output driver circuit 105.

When the VGA sub-state machine 504 hands off control to the offset cancelation sub-state machine 505, the offset cancelation sub-state machine 505 uses the digital loop-control value forwarded to it by the initialization sub-state machine 501 to retrieve one or more digital loop-control values from the LUTs 225. The retrieved digital loop-control value(s) is then forwarded to the DAC 227, which converts the digital loop-control value(s) into one or more respective analog loop-control value(s), $VGA_1$-$VGA_N$, and outputs the respective value(s) to the respective S/H circuits $222_3$-$222_P$, thereby adjusting the gain of one or more of the gain stages $204_1$-$204_N$. The S/H circuits $222_3$-$222_P$ maintain the analog loop-control values for a predetermined time period so that the gain(s) of the respective gain stage(s) $204_1$-$204_N$ is held constant for the predetermined time period. Once the predetermined time period has ended, the offset cancelation sub-state machine 505 returns control to the initialization sub-state machine 501, which then performs re-initialization of the state machine 500.

It should be noted that although the illustrative embodiments have been described with reference to a few illustrative embodiments for the purpose of demonstrating the principles and concepts of the invention. Persons of skill in the art will understand how the principles and concepts of the invention can be applied to other embodiments not explicitly described herein. It should also be noted that the circuits and method described above with reference to FIGS. 1-5 are merely examples of suitable circuit configurations and methods that demonstrate the principles and concepts of the invention. As will be understood by those skilled in the art in view of the description being provided herein, many modifications may be made to the embodiments described herein while still achieving the goals of the invention, and all such modifications are within the scope of the invention.

What is claimed is:

1. A digitally-controlled transimpedance amplifier (TIA) circuit comprising:
a first TIA having a first input terminal and a first output terminal;
a first variable impedance having first and second terminals electrically coupled to the first input and first output terminals, respectively;
at least a first variable gain amplifier (VGA) circuit having a second input terminal and a second output terminal, the second input terminal being electrically coupled to the first output terminal;
an output driver circuit having a third input terminal and a third output terminal, the third input terminal being electrically coupled to the second output terminal; and
digital loop-control circuitry comprising analog-to-digital conversion (ADC) circuitry, digital controller circuitry and digital-to-analog conversion (DAC) circuitry, the ADC circuitry being electrically coupled to the first, second and third output terminals, the ADC circuitry and converting first, second and third output signals outputted from the TIA, the VGA circuit and the output driver circuit into at least first, second and third digital signals, the digital controller circuitry processing the first, second and third digital signals and producing P digital control signals, where P is a positive integer that is equal to N+2, where N is a positive integer, the DAC circuitry being electrically coupled to the digital controller circuitry, the DAC converting the P digital control signals into P analog control signals, respectively, and wherein P–2 of the analog control signals are fed back to the VGA circuit and used to vary a gain of at least one gain stage of the VGA circuit, and wherein one of the P analog control signals is fed back to direct current (DC) offset cancellation circuitry for use as a DC offset cancellation value by the DC offset cancellation circuitry.

2. The digitally-controlled TIA circuit of claim 1, wherein the ADC circuitry also receives a received signal strength indicator (RSSI) signal output from an RSSI circuit that measures a signal strength of an electrical analog signal produced by a photodetector that is electrically coupled to the first input terminal of the first TIA, and wherein the ADC converts the RSSI signal into a digital RSSI signal, and wherein the digital controller processes the RSSI signal to produce one of the P–2 analog control signals that is fed back to the TIA and used to vary an impedance of the first variable impedance.

3. The digitally-controlled TIA circuit of claim 2, wherein one or more of the P–2 analog control signals is fed back to the VGA circuit to cause the gain of one or more gain stages of the VGA to be adjusted to perform offset cancelation to prevent the third output signal from saturating.

4. The digitally-controlled TIA circuit of claim 1, wherein the digital controller performs a loop-control algorithm that processes the first, second and third digital signals to algorithmically convert the first, second and third digital signals into the P digital control signals.

5. The digitally-controlled TIA circuit of claim 2, wherein the digital loop-control circuitry includes at least a first lookup table (LUT), and wherein the digital controller produces the P digital control signals by using the first, second and third digital signals to retrieve the P digital control signals from said at least a first LUT.

6. The digitally-controlled TIA circuit of claim 5, further comprising:
P sample-and-hold (S/H) circuits electrically coupled to the DAC circuitry, wherein the analog control signals are maintained by the respective S/H circuits for respective predetermined time periods and in a predetermined sequence such that the analog control signals are fed back to the VGA circuit, to the first variable impedance and to the DC offset cancellation circuitry for respective predetermined periods of time in a predetermined sequence.

7. The digitally-controlled TIA circuit of claim 6, wherein the digital controller comprises a state machine having at least a VGA sub-state machine, a DC offset cancellation sub-state state, an RSSI sub-state machine, and wherein the sub-state machines operate in a round-robin sequence such that the respective analog control signals are sampled and held by the respective S/H circuits in a round-robin sequence for respective predetermined periods of time.

8. A digitally-controlled transimpedance amplifier (TIA) circuit comprising:
a first TIA having a first input terminal and a first output terminal;
a first variable impedance having first and second terminals electrically coupled to the first input and first output terminals, respectively;
at least a first variable gain amplifier (VGA) circuit having a second input terminal and a second output terminal, the second input terminal being electrically coupled to the first output terminal, the VGA circuit having N variable gain stages where N is a positive integer;
an output driver circuit having a third input terminal and a third output terminal, the third input terminal being electrically coupled to the second output terminal; and
digital loop-control circuitry comprising analog-to-digital conversion (ADC) circuitry, digital controller circuitry and digital-to-analog conversion (DAC) circuitry, the ADC circuitry being electrically coupled to the first, second and third output terminals and to an output terminal of a received signal strength indicator (RSSI) circuit that measures a signal strength of an electrical analog signal produced by a photodetector that is electrically coupled to the first input terminal of the first TIA and outputs an RSSI output signal from an RSSI output terminal of the RSSI circuit, the ADC circuitry converting first, second, third output signals and the RSSI output signal output from said first, second and third output terminals and from the RSSI output terminals into at least first, second, third and fourth digital signals, the digital controller circuitry processing the first, second, third and fourth digital signals and producing P digital control signals, where P is equal to at least N+2, the DAC converting the P digital control signals into P analog control signals, respectively, and wherein P−2 of the analog control signals are fed back to the VGA circuit and used to vary gains of one or more of the N variable gain stages, respectively, and wherein one of the P analog control signals is fed back to direct current (DC) offset cancellation circuitry for use as a DC offset cancellation value by the DC offset cancellation circuitry, and wherein one of the P−2 analog control signals is fed back to the TIA and used to vary an impedance of the first variable impedance.

9. The digitally-controlled TIA circuit of claim 8, wherein P is equal to at least N+3, and wherein one or more of the analog control signals is fed back to the VGA circuit to cause the gain of one or more variable gain stages of the VGA to be adjusted to perform offset cancelation to prevent the third output signal from saturating.

10. The digitally-controlled TIA circuit of claim 9, wherein the digital controller performs a loop-control algorithm that processes the first, second, third and fourth digital signals to algorithmically convert the first, second, third and fourth digital signals into the P digital control signals.

11. The digitally-controlled TIA circuit of claim 8, wherein the digital loop-control circuitry includes at least a first lookup table (LUT), and wherein the digital controller produces the P digital control signals by using the first, second, third and fourth digital signals to retrieve the P digital control signals from said at least a first LUT.

12. The digitally-controlled TIA circuit of claim 11, further comprising:
P sample-and-hold (S/H) circuits electrically coupled to the DAC circuitry, wherein the analog control signals are maintained by the respective S/H circuits for respective predetermined time periods and in a predetermined sequence such that the analog control signals are fed back to the VGA circuit, to the first variable impedance and to the DC offset cancellation circuitry for respective predetermined periods of time in a predetermined sequence.

13. The digitally-controlled TIA circuit of claim 12, wherein the digital controller comprises a state machine having at least a VGA sub-state machine, a DC offset cancellation sub-state state, an RSSI sub-state machine, and wherein the sub-state machines operate in a round-robin sequence such that the respective analog control signals are sampled and held by the respective S/H circuits in a round-robin sequence for respective predetermined periods of time.

14. A method of performing digital feedback loop control in a transimpedance amplifier (TIA) circuit, the method comprising:
in digital loop-control circuitry, receiving first, second, third and fourth output signals from a first TIA, a first variable gain amplifier (VGA) circuit, an output driver circuit, and a received signal strength indicator (RSSI) circuit, respectively, the first TIA having a first input terminal and a first output terminal, wherein a variable impedance is electrically coupled to the TIA in a feedback loop interposed between the first input terminal and the first output terminal, the VGA circuit having a second input terminal and a second output terminal, the second input terminal being electrically coupled to the first output terminal, the VGA circuit having N variable gain stages where N is a positive integer, the output driver circuit having a third input terminal and a third output terminal, the third input terminal being electrically coupled to the second output terminal;

with analog-to-digital conversion (ADC) circuitry of the digital loop-control circuitry electrically coupled to the first, second and third output terminals and to an output terminal of a received signal strength indicator (RSSI) circuit that measures a signal strength of an electrical analog signal produced by a photodetector, receiving first, second, third and fourth signals output from the TIA, the VGA circuit, the output driver circuit and the RSSI circuit, respectively, and converting the first, second, third and fourth output signals into at least first, second, third and fourth digital signals;

in a digital controller of the digital loop-control circuitry, processing the first, second, third and fourth digital signals and producing P digital control signals, where P is equal to at least N+2;

with a digital-to-analog converter (DAC) of the digital loop-control circuitry, converting the P digital control signals into P analog control signals, respectively; and with the digital loop control circuitry, feeding P−2 of the analog control signals back to the VGA circuit for use in varying a gain of one or more of the N variable gain stages, respectively, feeding one of the P analog control signals back to direct current (DC) offset cancellation circuitry for use as a DC offset cancellation value by the DC offset cancellation circuitry, and feeding one of the P−2 analog control signals back to the TIA for use in varying the variable impedance.

15. The method of claim 14, wherein P is equal to at least N+3, and wherein the method further comprises feeding one or more of the analog control signals back to the VGA circuit to cause the gain of one or more of the variable gain stages of the VGA to be adjusted to perform offset cancelation to prevent the third output signal from saturating.

16. The method of claim 14, wherein the step of processing the first, second, third and fourth digital signals and producing P digital control signals is performed by a digital controller that executes a loop-control algorithm that processes the first, second, third and fourth digital signals to algorithmically convert the first, second, third and fourth digital signals into the P digital control signals.

17. The method of claim 14, wherein the step of processing the first, second, third and fourth digital signals and producing P digital control signals includes using the first, second, third and fourth digital signals to retrieve the P digital control signals from at least a first lookup table (LUT) of the digital loop-control circuitry.

18. The method of claim 17, further comprising:
with P sample-and-hold (S/H) circuits electrically coupled to the DAC circuitry, maintaining the analog control signals for respective predetermined time periods and in a predetermined sequence such that the analog control signals are fed back to the VGA circuit, to the variable impedance and to the DC offset cancellation circuitry for respective predetermined periods of time in a predetermined sequence.

19. The method of claim 18, wherein the digital controller comprises a state machine having at least a VGA sub-state machine, a DC offset cancellation sub-state machine, an RSSI sub-state machine, and wherein the sub-state machines operate in a round-robin sequence such that the respective analog control signals are sampled and held by the respective S/H circuits in a round-robin sequence for respective predetermined periods of time.

20. The method of claim 17, wherein P is equal to at least N+3, and wherein the method further comprises feeding one or more of the analog control signals back to the VGA circuit to cause the gain of one or more variable gain stages of the VGA to be adjusted to perform offset cancelation to prevent the third output signal from saturating.

\* \* \* \* \*